United States Patent [19]

Morishige

[11] Patent Number: 5,233,496
[45] Date of Patent: Aug. 3, 1993

[54] ELECTRONIC EQUIPMENT INCORPORATING AN INTEGRATED BTL CIRCUIT

[75] Inventor: Toshiyuki Morishige, Kawasaki, Japan

[73] Assignee: Kabushiki Kaisha Toshiba, Kawasaki, Japan

[21] Appl. No.: 668,626

[22] Filed: Mar. 13, 1991

[30] Foreign Application Priority Data

Mar. 16, 1990 [JP] Japan .................................. 2-66693

[51] Int. Cl.[5] ........................................... G01R 31/02
[52] U.S. Cl. .................................... 361/49; 340/652; 324/503
[58] Field of Search .......................... 361/42, 49, 50; 340/652; 324/503, 527, 537, 511, 546

[56] References Cited

U.S. PATENT DOCUMENTS

| | | | |
|---|---|---|---|
| 3,849,772 | 11/1974 | Burnett | 340/652 |
| 3,989,908 | 11/1976 | Budrys | 340/652 |
| 3,990,020 | 11/1975 | Porter, III | 330/207 P |
| 4,612,453 | 9/1986 | Yamazaki | 340/652 |
| 4,799,019 | 1/1989 | Cooley | 340/652 |
| 4,894,605 | 1/1990 | Ringleb | 324/537 |
| 4,962,350 | 10/1990 | Fukuda | 323/283 |

FOREIGN PATENT DOCUMENTS 0406967 7/1990 European Pat. Off. .

OTHER PUBLICATIONS

European Search Report: Patent Abstracts of Japan, Power Distributor Circuit, vol. 4, No. 63 (E-10) (545), May 13, 1990, Tokyo Shibaura Denki, KK.
Patent Abstracts of Japan, Load Disconnection Detector, vol. 10, No. 157 (P-464), Jun. 6, 1986, Tateishi Denki, KK.
Patent Abstracts of Japan, Power Amplifier Circuit, vol. 13, No. 320 May 26, 1989, (E-764) 3578), NEC Corp.

Primary Examiner—Steven L. Stephan
Assistant Examiner—Adolf Berhane
Attorney, Agent, or Firm—Banner, Birch, McKie & Beckett

[57] ABSTRACT

A low-frequency power amplifier with an integrated BTL output circuit drives a load. The amplifier incorporates a bias circuit for supplying a bias voltage to each circuit composing the amplifier, a control circuit for switching between the normal operation mode and the mode for detecting the load being in an open-circuit condition, a detector circuit for detecting the load being in an open-circuit mode by supplying current to the load and sensing the current flowing through the load, and an output circuit for telling an external circuit of the integrated circuit that the load is in an open-circuit mode. All these circuits are squeezed into a single chip. The control circuit controls the bias circuit and detector circuit. During normal operation, the BTL output circuit is in an operative state, while the detector circuit is in a nonoperative state. When the load is detected being in an open-circuit mode, the bias circuit is forced to stop operation, which causes the BTL output circuit to stop operation, thereby enabling the detector means to sense that the load is in an open-circuit mode.

22 Claims, 4 Drawing Sheets

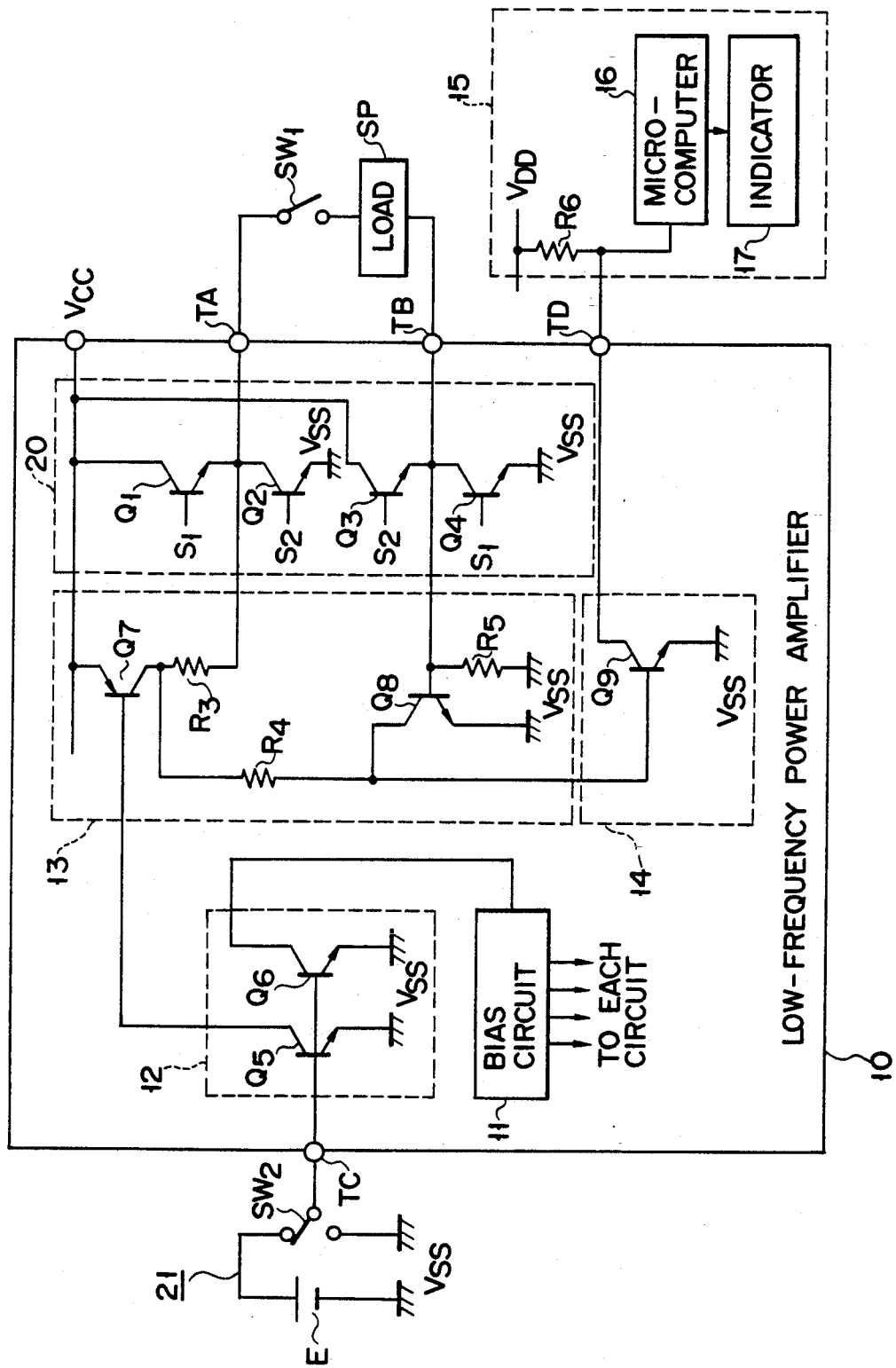
F I G. 3

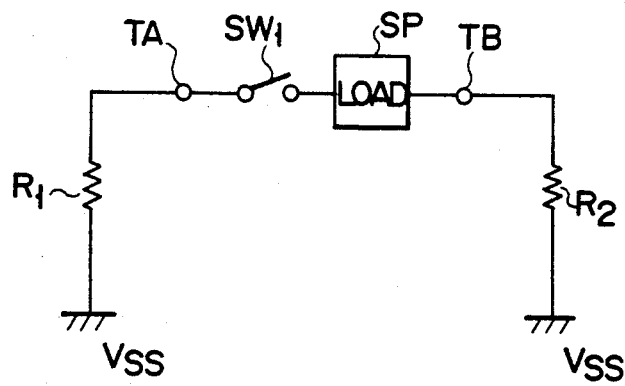
F I G. 4
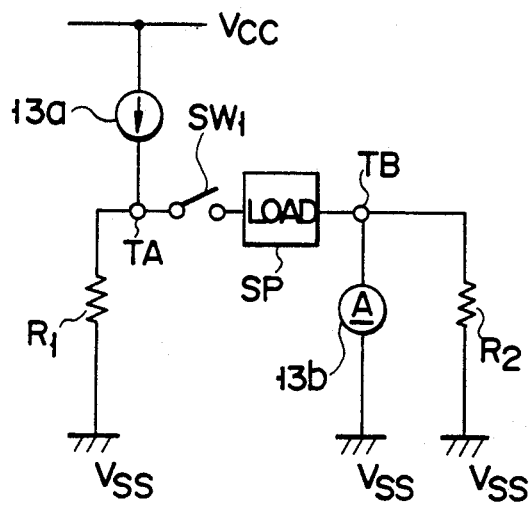
F I G. 5
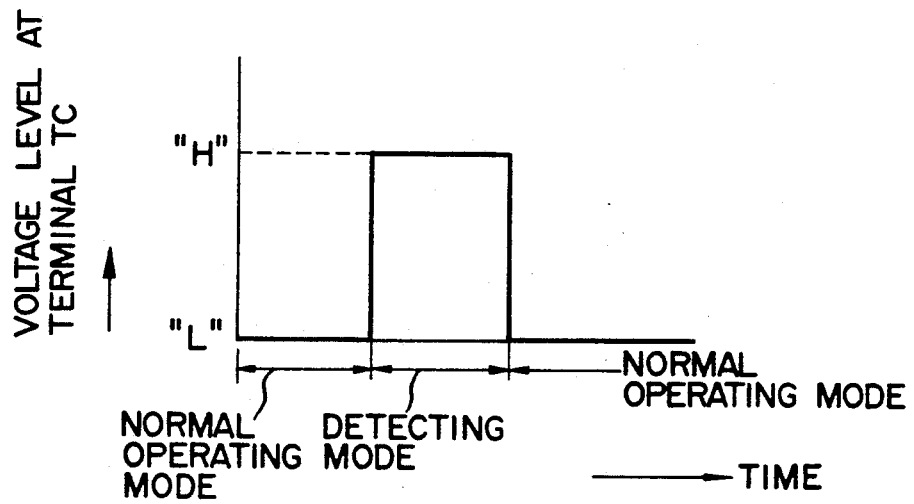
F I G. 6

ELECTRONIC EQUIPMENT INCORPORATING AN INTEGRATED BTL CIRCUIT

BACKGROUND OF THE INVENTION

Field of the Invention

This invention generally relates to on-vehicle electronic equipment, for example, and more particularly to electronic equipment containing an integrated BTL (Balanced Transformerless or Bridge-Tied Load) output circuit.

Description of the Related Art

Low-frequency power amplifiers generally perform power-amplification of the input signal and supply the output signal to the speaker that in turn produces sound. Should the load (speaker, in this case) connected to the amplifier's output terminal be open-circuit for some reason, it could not receive the output signal so that it would produce no sound.

Such sound-producing failure in electronic equipment incorporating low-frequency power amplifying circuitry, such as a radio set, radio-cassette deck combination, stereo recording/reproducing apparatus, television set, and video tape recording/reproducing apparatus, may be ascribed to defective parts, wiring disconnections, poor plug connections and others. Conventionally, to investigate the causes, a defective device has been disassembled to check each circuit block of it for voltage, current, and resistance with measuring instruments such as a multimeter. This has involved a lot of labor and high technical skills.

With this backdrop, it is desirable to provide highly reliable on-vehicle electronic equipment with an automatic function that checks the low-frequency power amplifier-actuated load for open-circuit. In the case of a low-frequency power amplifier containing an integrated BTL output circuit, however, it is very difficult to detect the load being in an open-circuit mode.

The reason for this will be explained in detail, referring to FIGS. 1 and 2. FIG. 1 shows an integrated BTL output circuit in car-carried electronic equipment and a load (a speaker, in this case) connected between output terminals TA and TB of the BTL output circuit that is composed of a first to fourth n-p-n transistors $Q_1$ to $Q_4$ at the output stage. The collector and emitter of the first transistor $Q_1$ are connected to a power supply $V_{CC}$ and the output terminal TA, respectively; the collector and emitter of the second transistor $Q_2$ are connected to the output terminal TA and the ground point $V_{SS}$, respectively; the collector and emitter of the third transistor $Q_3$ are connected to the power supply $V_{CC}$ and the output terminal TB, respectively; and the collector and emitter of the fourth transistor $Q_4$ are connected to the output terminal TB and the ground point $V_{SS}$, respectively. The bases of the transistors $Q_1$ and $Q_4$ are supplied with a driving signal $S_1$, while the bases of the transistors $Q_2$ and $Q_3$ are supplied with a driving signal $S_2$ opposite in phase to the signal $S_1$, which enables on/off control.

In this arrangement, supplied to the transistors $Q_1$ to $Q_4$ are the driving signal $S_1$ and the driving signal $S_2$ opposite in phase to the signal $S_1$, each of which is produced by a preamplifier (not shown), including a phase inverting circuit, that receives a sine-wave signal, for example. During positive half-cycle of the sine-wave signal, transistors $Q_1$ and $Q_4$ are on, while transistors $Q_2$ and $Q_3$ are off. This allows the power supply $V_{CC}$ to flow current through the collector and emitter of the transistor $Q_1$, the speaker SP that acts as a load, the collector and emitter of the transistor $Q_4$, and to the ground point $V_{SS}$. During the negative half-cycle, transistors $Q_2$ and $Q_3$ are on, while transistors $Q_1$ and $Q_4$ are off. This permits the power supply $V_{CC}$ to flow current through the collector and emitter of the transistor $Q_3$, the load speaker SP, the collector and emitter of the transistor $Q_2$, and to the ground point $V_{SS}$.

Regardless of the load being open-circuit or closed-circuit, the BTL output circuit has the direct-current (DC) voltage at the TA and TB output-terminal pair set at nearly $V_{CC}/2$ (in the case of $V_{SS}$ equal to 0 V) as shown in the equivalent circuit of FIG. 2, with the result that the DC voltage difference between output terminals TA and TB is theoretically zero. During the operation of the BTL output circuit, the DC voltage at each of the output terminals TA and TB is thus approximately $V_{CC}/2$ ($V_{SS} = 0$ V), which makes it impossible to detect the open-circuit load.

Application of integrated BTL output circuits is not restricted to the above-mentioned low-frequency power amplifiers, they may be applied to motor driving circuits, in which similar problems can be encountered.

As described above, electronic equipment incorporating integrated BTL output circuitry has difficulty in building in a function that detects the load being in an open-circuit mode.

SUMMARY OF THE INVENTION

Accordingly, an object of the present invention is to provide electronic equipment capable of detecting the load being in an open-circuit mode in an integrated BTL output circuit.

The object of the present invention is achieved by electronic equipment comprising: a detecting circuit for detecting a load connected between two output terminals of a BTL output circuit being in an open-circuit mode, based on the magnitude of current flowing through the load; and a control circuit for controlling the BTL output circuit to put it in an operative state during normal operation, and in a nonoperative state upon detecting the load being in an open-circuit mode, and for controlling the detecting circuit to put it in a nonoperative state during normal operation, and in an operative state upon detecting the load being in an open-circuit mode.

With this configuration, the detecting circuit checks the load for open-circuit with the BTL output circuit put in a nonoperative state by the control circuit. The detecting circuit determines whether or not the load, connected across the output-terminal pair of the BTL output circuit, is open-circuit based on the current flowing through the load. This makes it possible to detect the load being in an open-circuit mode, which is connected to electronic equipment incorporating a BTL output circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 3 is a circuit diagram illustrating a BTL output circuit and a detecting circuit for detecting the load being in an open-circuit mode, both of which are incorporated in a low-frequency power amplifier contained in electronic equipment according to an embodiment of the present invention;

FIGS. 4 and 5 are equivalent circuits used to explain the principle of the circuits of FIG. 3 detecting the open-circuit load; and FIGS. 6 and 7 are timing charts used to explain the way of detecting the load being in an open-circuit mode.

DETAILED DESCRIPTION OF THE PREFERRED EMBODIMENTS

Figure 1:
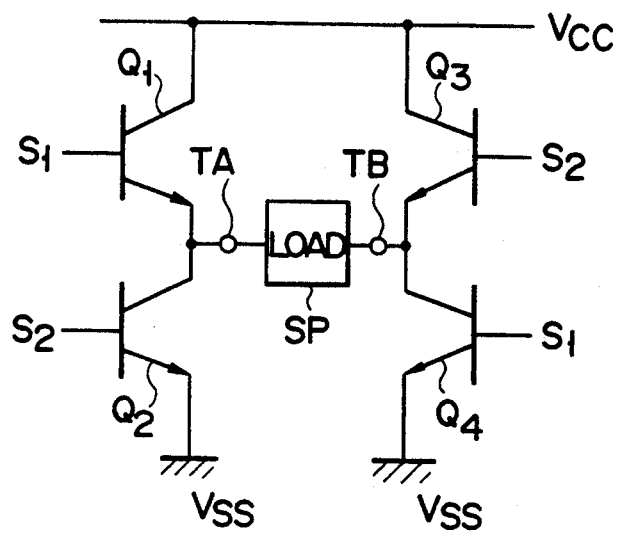
FIG. 1 is a circuit diagram for a conventional BTL output circuit with a load connected across a pair of output terminals of the circuit.
Figure 2:
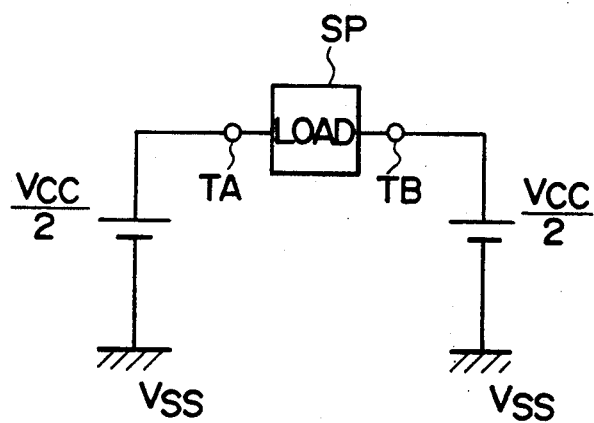
FIG. 2 is an equivalent circuit diagram when the load is open-circuit and closed-circuit in the BTL output circuit of FIG. 1.

FIG. 3 shows: a BTL output circuit 20 built in a low-frequency power amplifier 10; a load (a speaker, in this case) SP; and a circuit for detecting the load SP being in an open-circuit mode, in electronic equipment according to an embodiment of the present invention. The amplifier 10 contains: the BTL output circuit 20; a bias circuit 11 for applying a bias voltage and a current to each circuit constituting the amplifier 10; a control circuit 12 for making switching control between the normal operation mode and the open-circuit load detecting mode; a detecting circuit 13 for detecting the load being in an open-circuit state; and an output circuit 14 for supplying to external circuitry a signal which tells that the load has been detected being in an open-circuit state. All these circuits are integrated into a single chip. The load SP is connected across the TA-TB output terminal pair of the BTL output circuit 20. The on/off state of the switch $SW_1$ between the output terminal TA and load SP equivalently represents a load SP-connected state (with switch $SW_1$ on) and a load-disconnected state (with switch $SW_1$ off), respectively. The control input terminal TC connected to the control circuit 12 is connected to a mode changeover signal output circuit 21 for supplying a mode switching signal, which is composed of a DC power supply E and a switch $SW_2$. The circuit 21 applies the potential from the power supply E to the control circuit 12, thereby to detect that the load SP is in an open-circuit mode, and applies the ground potential to the circuit 12, thereby to operate the amplifier 10 in normal operation mode. The circuit 21 can be of the type which is controlled by a microcomputer, such that to applies the power-supply potential and the ground potential in response to a high-level output and a low-level output of the microcomputer, respectively. The output terminal TD connected to the output circuit 14 is connected to an indicating device 15 for telling the load SP is open-circuit.

The BTL output circuit 20, like the equivalent in FIG. 1, is composed of a first to fourth n-p-n transistors $Q_1$ to $Q_4$ at the output stage. The collector and emitter of the first transistor $Q_1$ are connected to a power supply $V_{CC}$ and the output terminal TA, respectively; the collector and emitter of the second transistor $Q_2$ are connected to the output terminal TA and the ground point $V_{SS}$, respectively; the collector and emitter of the third transistor $Q_3$ are connected to the power supply $V_{CC}$ and the output terminal TB, respectively; and the collector and emitter of the fourth transistor $Q_4$ are connected to the output terminal TB and the ground point $V_{SS}$, respectively. The bases of the transistors $Q_1$ and $Q_4$ are supplied with a driving signal $S_1$, while the bases of the transistors $Q_2$ and $Q_3$ are supplied with a driving signal $S_2$ opposite in phase to the signal $S_1$, which enables on/off control. The driving signals $S_1$ and $S_2$ are produced by a preamplifier (not shown) or the like contained in the low-frequency power amplifier 10.

The control circuit 12 is made up of n-p-n transistors $Q_5$ and $Q_6$, each base of which is connected to the control input terminal TC and each emitter of which is connected to the ground point $V_{SS}$. The collector of the transistor $Q_5$ is connected to the base of the p-n-p transistor $Q_7$ in the detecting circuit 13 which is controlled through this connection. The collector of the transistor $Q_6$ is connected to the control input terminal for controlling the bias circuit 11 which is controlled through this connection.

The detecting circuit 13 is composed of the transistor $Q_7$ and n-p-n transistor $Q_8$ and resistors $R_3$ to $R_5$. The emitter base, and collector of the transistor $Q_7$ respectively are connected to the power supply $V_{CC}$, the collector of the transistor $Q_5$, one end of each of the resistors $R_3$ and $R_4$. The other end of $R_3$ is connected to the output terminal TA, while the other end of $R_4$ is connected to the collector of the transistor $Q_8$, the base and emitter of which are connected to the output terminal TB and the ground point $V_{SS}$, respectively. The resistor $R_5$ is connected between the base of the transistor $Q_8$ and the ground point $V_{SS}$.

The output circuit 14 is composed of an n-p-n transistor $Q_9$, the base, collector, and emitter of which are connected to the collector of the n-p-n transistor $Q_8$, the output terminal TD, and the ground point $V_{SS}$, respectively.

The indicating device 15 essentially consists of a resistor $R_6$, a microcomputer 16, and an indicator 17 for indicating that the load SP is open-circuit. One end of the resistor $R_6$ is connected to an external power supply $V_{DD}$, while the other end of it is connected to the output terminal TD. The microcomputer 16 detects the output level of the output terminal TD for display processing of the open-circuit state of the load SP. The indicator 17, whose display including on/off state representation is controlled by the microcomputer 16, is composed of, for example, light-emitting diodes or liquid-crystal display unit on the operator panel in electronic equipment.

The operation principle of detecting the load SP being in an open-circuit state (where the switch $SW_1$ is off) will be explained, referring to FIGS. 4 and 5.

To sense that the load is in an open-circuit mode, the control circuit 12 is operated to cause the bias circuit 11 to stop supplying a bias voltage and a current to each circuit to force the BTL output circuit 20 to stop operation with the result that there is no DC voltage appearing between the output terminals TA and TB, while it actuates the detecting circuit 13. This mechanism is illustrated in the equivalent circuit of FIG. 4. Here, $R_1$ is an internal resistance when the BTL output circuit 20 is viewed from one output terminal TA, whereas $R_2$ is an internal resistance when the circuit 20 is viewed from the other output terminal TB. The detecting circuit 13 essentially consists of a constant-current source circuit 13a and a current detecting circuit 13b. As shown in FIG. 5, the constant-current source circuit 13a supplies current to the output terminal TA, while the current detecting circuit 13b senses the current flowing through the other output terminal TB. In this case, with the load connected, current flows through the other output terminal TB, but with the load disconnected, the current flowing through the same terminal TB is theoretically zero, which makes it possible to detect the open-circuit load.

The operation of sensing that the load is in an open-circuit mode will be explained in detail. The circuit shown in FIG. 3 has two operating modes each corresponding to the output levels of the mode change-over signal output circuit 21; it is in the normal operating mode with the output of the circuit 21 in a low level, whereas it is in the detecting mode for detecting open-circuit load with the circuit 21's output in a high level. When the mode changeover signal output circuit 21 supplies a changeover signal to the control input terminal TC at a timing, for example, as shown in FIG. 6, the bias circuit 11 is in an operative state and the detecting circuit 12 is in a nonoperative state with the mode changeover signal in a low level, whereas the bias circuit 11 is in a nonoperative state and the detecting circuit 13 is in an operative state with the signal in a high level. That is, with the mode changeover signal in a low level, each of the transistors $Q_6$ and $Q_5$ in the control circuit 12 is off, the bias circuit 11 is in normal operation, and the transistor $Q_7$ of the detecting circuit 13 is off, which causes both the detecting circuit 13 and output circuit 14 to be nonoperative. Consequently, the low-frequency power amplifier 10 operates in normal mode, allowing the BTL output circuit 20 to actuate the load SP.

With the mode changeover signal in a high level, each of the n-p-n transistors $Q_6$ and $Q_5$ in the control circuit 12 is on, the bias circuit 11 is nonoperative, and the transistor $Q_7$ of the detecting circuit 13 is on, which stops supply of a bias voltage and a current to each circuit in the low-frequency power amplifier 10, causing the amplifier 10 to stop operation. As a result, the BTL output circuit 20 also stops operation, making the transistors $Q_1$ to $Q_4$ off. With the transistor $Q_7$ on, the control circuit 13 and output circuit 14 operate as follows, depending on whether or not the load SP is connected between the output terminals TA and TB (or whether switch $SW_1$ is on or off).

Figure 7:
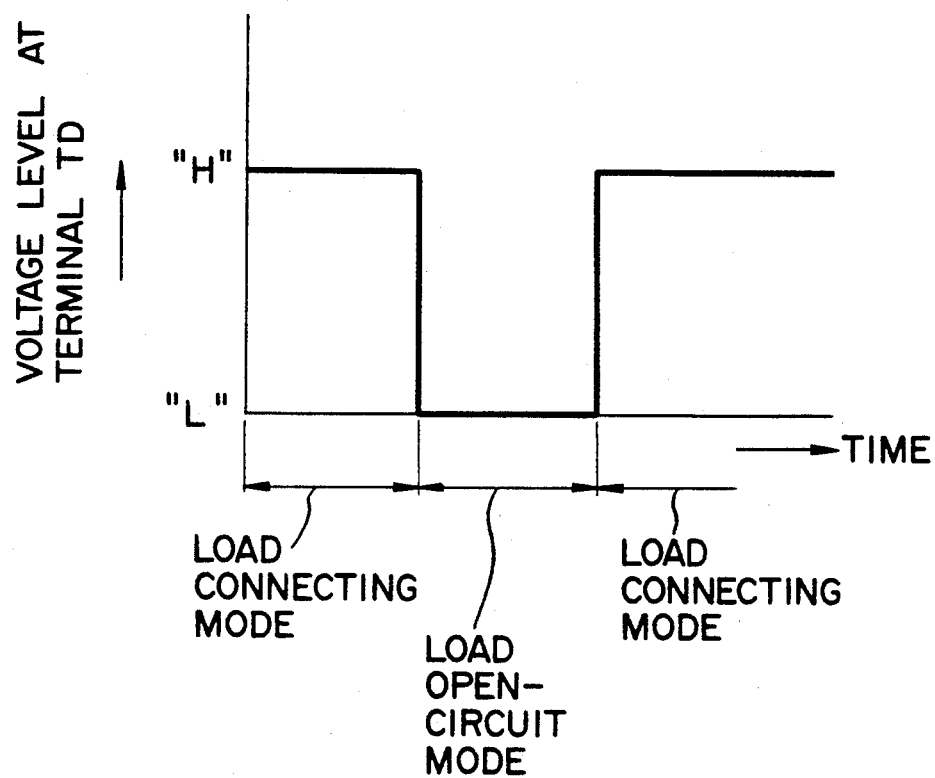

When the load SP is connected across the output terminals TA and TB (the same as the switch $SW_1$ being on), the power supply $V_{CC}$ flows current through the emitter to collector of the transistor $Q_7$, resistor $R_3$, output terminal TA, load SP, output terminal TB, resistor $R_5$, and to the ground point $V_{SS}$. As a result of this, there is a voltage drop across the resistor $R_5$, which makes the transistor $Q_8$ on and the transistor $Q_9$ off. Consequently, the output terminal TD is charged via the resistor $R_6$ by the power supply $V_{DD}$ in the indicating device 15 with the result that it is in a high level as shown in FIG. 7. When the microcomputer 16 detects the high level at the output terminal TD, the indicator 17 is not driven, causing no display of open-circuit load SP.

On the other hand, with the load SP being open-circuit between the output terminals TA and TB (the same as the switch $SW_1$ being off), current does flow in the manner just mentioned above, but flows starting from the power supply $V_{CC}$ through the emitter and collector of the transistor $Q_7$, resistor $R_4$, and through the base of the transistor $Q_9$. As a result, the transistor $Q_9$ turns on, making the output terminal TD of a low level. When the microcomputer 16 senses that the output terminal TD is in a low level as shown in FIG. 7, the indicator 17 is actuated to come on or blink.

With this arrangement, it is possible to determine whether or not a failure in the load SP is ascribed to its open-circuit. This makes it unnecessary to disassemble the device and check each circuit block of the device for voltage current, resistance and other factors with instruments such as a multimeter, saving a lot of labor. Additionally, for example, supply of detection initiating control signal from the microcomputer 16 to the switch $SW_2$ at start-up makes it possible to provide an automatic checking function for load's open-circuit condition. Accordingly, the above-described low-frequency amplifier 10 is most suitable for cars requiring highly reliable circuitry.

This invention is not restricted to the low-frequency power amplifier explained in the above embodiment, it may be applied to electronic equipment containing a motor driving circuit using an integrated BTL output circuit.

As described above, according to the present invention, it is possible to provide electronic equipment capable of automatically detecting the load being in an open-circuit mode in an integrated BTL output circuit.

What is claimed is:

1. An electronic apparatus incorporating an integrated balanced transformerless load (BTL) output circuit, the integrated BLT output circuit comprising:
   detecting means for detecting an open-circuit mode of a load connected between two output terminals of said BLT output circuit based on the magnitude of current flowing through said load; and
   control means coupled to the detecting means for placing said BTL output circuit in an operative state during normal operation and in a nonoperative state during an open-circuit detection mode, and upon detection of said load being in an open-circuit mode, and for placing said detecting means in a nonoperative state during normal operation of the BTL output circuit and in an operative state during an open-circuited detection mode, and upon detecting said load being in an open-circuit mode.

2. The electronic apparatus according to claim 1, wherein said detecting means includes constant-current supplying means for supplying a constant current to a first terminal of said two output terminals; and current detecting means for detecting the current supplied to a second terminal of said two output terminals from said load.

3. The electronic apparatus according to claim 2, wherein said constant-current supplying means includes a transistor having a collector-emitter path coupled to a power supply and being controlled by said control means, and a resistor coupled to the collector-emitter path of said transistor and to the first terminal of said two output terminals.

4. The electronic apparatus according to claim 2, wherein said current detecting means includes a resistor coupled between the second terminal of said two output terminals and a reference node, and a transistor having a base is connected to the second terminal of said two output terminals and a collector-emitter path coupled between the reference node and said constant-current supplying means.

5. The electronic apparatus according to claim 1, further comprising output means for outputting a signal indicative of whether the open circuit mode is detected by said detecting means.

6. The electronic apparatus according to claim 5, wherein said output means includes a transistor having a collector-emitter path coupled between a third output terminal and a reference node and responsive to said detecting means.

7. The electronic apparatus according to claim 1, wherein said control means includes a first transistor having a collector-emitter path coupled between said detecting means and a reference node and being controlled by a mode changeover signal, and a second transistor having a collector-emitter path coupled between a bias means and the reference node and being controlled by the mode changeover signal.

8. The electronic apparatus according to claim 1, further comprising mode changeover signal supplying means for supplying a mode changeover signal to said control means.

9. The electronic apparatus according to claim 8, wherein said mode changeover signal supplying means includes switching means for supplying to said control means a first mode changeover signal during normal operation and a second mode changeover signal in an open-circuit detection mode.

10. The electronic apparatus according to claim 1, further comprising display means responsive to the detecting means for displaying whether the load is detected to be in an open-circuit mode.

11. The electronic apparatus according to claim 10, wherein said display means includes a microcomputer and an indicator.

12. An electronic apparatus incorporating an integrated balanced transformerless load (BTL) output circuit comprising:
   a load connected between first and second output terminals of said BTL output circuit;
   current supplying means for supplying a current to said first output terminal of said BTL output circuit;
   current detecting means for detecting current flowing through said load to said second output terminal;
   output means responsive to said current detecting means for outputting a first signal;
   first control means for placing said BTL output circuit in an operative state during normal operation and in a nonoperative state during an open-circuit detection mode, and upon detecting said load being in an open-circuit mode; and
   second control means for placing said current supplying means in a nonoperative state during normal operation of the BTL output circuit and in an operative state during an open-circuit detection mode and upon detecting said load being in an open-circuit mode.

13. The electronic apparatus according to claim 12, wherein said current supplying means includes a transistor having a collector-emitter path coupled to a power supply and controlled by an output of said second control means, and a resistor coupled between the collector-emitter path of said transistor and said first output terminal.

14. The electronic apparatus according to claim 12, wherein said current detecting means includes a resistor coupled between said second output terminal and a reference node; and a transistor having a base coupled to said second output terminal and a collector-emitter path coupled between the reference node and said current supplying means.

15. The electronic apparatus according to claim 12, wherein said output means includes a transistor having a collector-emitter path coupled between a third output terminal and a reference node and controlled by said current detecting means.

16. The electronic apparatus according to claim 12, wherein said first control means includes a transistor having a collector-emitter path coupled to a bias means for outputting a bias voltage and a reference mode and controlled by a mode changeover signal.

17. The electronic apparatus according to claim 12, wherein said second control means includes a transistor having a collector-emitter path coupled between said current supplying means and a reference node and is controlled by a mode changeover signal.

18. The electronic apparatus according to claim 12, further comprising mode changeover signal supplying means for supplying a mode changeover signal to said first and second control means.

19. The electronic apparatus according to claim 18, wherein said mode changeover signal supplying means, which includes a power supply and a switch for switching between a potential of said power supply and a potential of a reference node, supplies to said first and second control means the potential of the reference node in the normal operation mode and the potential of said power supply in the open-circuit detection mode.

20. The electronic apparatus according to claim 12, further comprising display means responsive to said output means for displaying whether said load is detected to be in an open-circuit mode.

21. The electronic apparatus according to clam 20, wherein said display means includes a resistor connected between an output node of said output means and a power supply, a microcomputer having an input node connected to the output node of said output means, and an indicator controlled by an output of said microcomputer.

22. The electronic apparatus according to claim 12 wherein said current supplying means supplies a constant current to said first output terminal of said BTL output circuit.

* * * * *